United States Patent
Sugawara et al.

(10) Patent No.: US 6,552,405 B2
(45) Date of Patent: Apr. 22, 2003

(54) PHOTOELECTRIC CONVERSION DEVICE AND MANUFACTURING METHOD THEREOF

(75) Inventors: Shin Sugawara, Yokaichi (JP); Takeshi Kyoda, Yokaichi (JP); Hisao Arimune, Yokaichi (JP)

(73) Assignee: Kyocera Corporation, Kyoto (JP)

(*) Notice: Subject to any disclaimer, the term of this patent is extended or adjusted under 35 U.S.C. 154(b) by 0 days.

(21) Appl. No.: 09/916,868

(22) Filed: Jul. 26, 2001

(65) Prior Publication Data
US 2002/0033514 A1 Mar. 21, 2002

(30) Foreign Application Priority Data
Jul. 27, 2000 (JP) .................. 2000-227638
Aug. 28, 2000 (JP) .................. 2000-258025

(51) Int. Cl.$^7$ .............................. H01L 31/06
(52) U.S. Cl. ................................ 257/465
(58) Field of Search ........................ 257/461, 431, 257/465

(56) References Cited

U.S. PATENT DOCUMENTS

| | | | | |
|---|---|---|---|---|
| 4,514,580 A | * | 4/1985 | Bartlett | 136/250 |
| 4,703,553 A | * | 11/1987 | Mardesich | 438/89 |
| 5,670,791 A | * | 9/1997 | Halls et al. | 257/40 |
| 6,281,427 B1 | * | 8/2001 | Mitsuhiro et al. | 136/250 |
| 6,350,946 B1 | * | 2/2002 | Miyake et al. | 136/252 |
| 6,384,321 B1 | * | 5/2002 | Mikoshiba et al. | 136/263 |

FOREIGN PATENT DOCUMENTS

| | | |
|---|---|---|
| JP | 61-124179 | 6/1986 |
| JP | 61-59678 | 12/1986 |
| JP | 8-34177 | 3/1996 |
| JP | 2522024 | 5/1996 |
| JP | 2641800 | 5/1997 |
| JP | 10-233518 | 9/1998 |

* cited by examiner

Primary Examiner—Carl Whitehead, Jr.
Assistant Examiner—William C. Vesperman
(74) Attorney, Agent, or Firm—Hogan & Hartson, LLP

(57) ABSTRACT

A photoelectric conversion device according to the present invention comprises an aluminum substrate or a substrate formed with an aluminum layer thereon, numerous p type crystalline semiconductor particles deposited on the substrate, an insulator interposed among the numerous p type crystalline semiconductor particles, and a n type semiconductor region formed on the upper portions of the p type crystalline semiconductor particles. An alloy portion comprising the aluminum and the semiconductor material is formed in a boundary part between the aluminum layer and the p type crystalline semiconductor particles, and a p+ region is formed in an interfacial part between the alloy portion and the p type crystalline semiconductor particle on the side of the p type crystalline semiconductor particle.

Accordingly, reliability of the joining condition between the substrate and the crystalline semiconductor particles can be improved, thereby realizing a photoelectric conversion device having high conversion efficiency.

20 Claims, 5 Drawing Sheets

PHOTOELECTRIC CONVERSION DEVICE AND MANUFACTURING METHOD THEREOF

This application is based on applications Nos. 2000-227638 and 2000-258025 filed in Japan, the content of which is incorporated hereinto by reference.

BACKGROUND OF THE INVENTION

1. Field of the Invention

The present invention relates to a photoelectric conversion device, in particular, to a photoelectric device using numerous crystalline semiconductor particles. The photoelectric conversion device according to this invention is utilized suitably in solar cells.

2. Description of the Related Art

Advent of a next-generation, low-cost solar cell that allows the quantity of silicon material to be small has been eagerly awaited.

Photoelectric devices using crystalline semiconductor particles that have been proposed so far are shown in FIGS. 8–13.

FIG. 8 shows a structure disclosed in U.S. Pat. No. 4,514,580. In FIG. 8, a steel substrate 41 is surrounded by an aluminum film 42 to which crushed silicon particles 43 are joined. The aluminum film 42 in the areas where the silicon particles 43 are not present has an insulator layer 44 formed thereon. The upper portions of the silicon particles 43 are formed with n type silicon portions 45 thereon. A transparent conductive layer 46 is formed over the entire surfaces.

FIG. 9 shows a structure disclosed in Japanese Patent No. 2522024. In this structure, a substrate 47 is formed with a diffusion-preventive layer 48 on which a rear face electrode 49 comprising a doping impurity for p type is formed. N type silicon particles 52 are densely deposited on the rear face electrode 49. The silicon particles 52 and the rear face electrode 49 are brought into contact and heated for alloying the silicon particles 52 and the material of the rear face electrode 49. Then, they are cooled, thereby forming p type regions 50 partially within the n type silicon particles. An insulator layer 51 is formed on the areas where the silicon particles 52 are not present, and a transparent conductive layer 53 is formed over the entire surface.

FIG. 10 shows a structure disclosed in Japanese Patent No. 2641800. In this structure, a tin layer 55 having a low melting point is formed on a stainless substrate 54. First conductive-type crystalline semiconductor particles 56 are deposited on the tin layer 55. An insulating layer 57 is formed on the areas where the crystalline semiconductor particles 56 are not present. After the upper portions of the crystalline semiconductor particles are ground, a second conductive-type amorphous semiconductor layer 58 is formed thereon. A metal electrode shaped as a strip is denoted by 59.

The structure in FIG. 11 is one disclosed in Japanese Patent Laid-Open Publication No. S61-124179. According to this structure, a first aluminum foil 62 is provided with openings into which silicon balls 63 having n type silicon surface portions 64 on the surfaces of p type silicon portions are inserted. The n type surface portions 64 in the rear faces of the silicon balls 63 are then removed. On a second aluminum foil 60 coated with an oxide layer 61, a part of the oxide layer 61 located at the rear faces of the silicon balls 63 is removed, thereby joining the silicon balls 63 to the second aluminum foil 60.

FIG. 12 discloses a method in which a high-melting point metal layer 66, a low melting-point metal layer 67, and semiconductor microcrystalline particles 68 are deposited on a substrate 65. The semiconductor microcrystalline particles 68 are fused, saturated and gradually cooled so that the semiconductor is grown by liquid phase epitaxial growth, thereby forming a liquid phase epitaxial polycrystalline thin film 71 (Refer to Japanese Patent Publication No.H8-34177).

In addition, FIG. 13. discloses a method in which a PN-junction is formed by forming a n type layer 73 that is formed by making an element, which is a n type impurity, diffused on both the front and rear surfaces of a p type substrate 72. In this method, a conductive diffusion region 74 to be connected to inside the p type layer 72 is formed by making the PN-junction penetrate the rear surface. A glass-type isolator 75 is formed around the conductive diffusion regions and baked so as to separate the PN-junction (Refer to, for example, Japanese Patent Publication No. S61-59678, and Japanese Patent Laid-Open Publication No. H10-233518).

However, in the photoelectric conversion device according to the U.S. Pat. No. 4,514,580 shown in FIG. 8, when the crushed silicon particles 43 are deposited on fused aluminum liquid heated up to its melting point 660° C. so as to be bonded thereto, the fused liquid flows out permitting only a small part of the silicon particles 43 to be bonded, the fused liquid climbs the surfaces of the silicon particles 43 causing short circuit, or the fused liquid scatters. Such phenomena make control of the junction characteristics difficult.

In the photoelectric conversion device in FIG. 9 disclosed in Japanese Patent No. 2522024, because of the PN-junction present below the incident light, loss is large when generated carriers are collected.

According to the photoelectric conversion device shown in FIG. 10 disclosed in Japanese Patent No. 2641800, the tin layer 55 on the stainless substrate 54 is fused so as to be joined to the first conductivity-type crystalline semiconductor particles 56. However, the extremely low melting point of tin has the problem of low reliability. In addition, since the second conductivity-type amorphous conductive layer 58 is formed on the first conductivity-type crystalline semiconductor particles 56, the surfaces of the crystalline semiconductor particles 56 need to be sufficiently etched and cleaned before the formation of the amorphous conductive layer 58 in order to form a secure PN-junction. Also, the film thickness has to be thin taking the large light absorption of the amorphous conductive layer 58 into account. However, the amorphous conductive layer 58 with such a small thickness has only small tolerance to defects necessitating stricter management of the cleaning process and the production environment, which leads to high-cost production.

According to the photoelectric conversion device in FIG. 11 disclosed in Japanese Patent Laid-Open Publication No. S61-124179, when silicon balls having n type surface portions 64 covering the p type cores 63 are joined to the second aluminum foil 60 so as to form an aluminum-silicon alloy layer, aluminum diffuses into the n type surface portions 64 causing the n type surface portions 64 to be destroyed. Also, because the first aluminum foil 62' has to be provided with openings into which the silicon balls are pressed so as to be joined thereto, evenness is required for the particle diameters of the silicon balls, which causes the cost to increase. In addition, because the temperature applied during the joining is below 577° C., which is the eutectic temperature of aluminum and silicon, the junction is unstable.

The photoelectric conversion device shown in FIG. 12 has problems that the low melting-point metal 67 mixes into the first conductivity-type liquid phase epitaxial polycrystalline layer 69 deteriorating the performance, and that the absence of insulator causes leakage to occur between the layer and the lower electrode 66.

In the case of using crystalline semiconductor particles in the photoelectric conversion device shown in FIG. 13, it is difficult in terms of manufacture to form the conductive diffusion region 74 such that it is connected to the internal layer by penetrating the PN-junction. In such a case, the PN-junction itself is fused and destroyed when the substrate and the crystalline semiconductor particles are joined together.

The present invention has been devised in consideration of the problems described above, and the object thereof is to provide a low-cost photoelectric conversion device having good conversion efficiency.

BRIEF SUMMARY OF THE INVENTION

A photoelectric conversion device according to the present invention comprises: a metal substrate or a substrate formed with a metal layer thereon; numerous first conductivity-type crystalline semiconductor particles deposited on the substrate; an insulator interposed among the first conductivity-type crystalline semiconductor particles; and a second conductivity-type semiconductor region formed on the upper portions of the first conductivity-type crystalline semiconductor particles, wherein a boundary part between the metal layer and the first conductivity-type crystalline semiconductor particles comprises an alloy portion comprising the metal and the semiconductor material, and a first conductive-type semiconductor region with high impurity concentration is formed in an interfacial part between the alloy portion and the first conductivity-type crystalline semiconductor particle on the side of the first conductivity-type crystalline semiconductor particle.

According to this photoelectric conversion device, owing to the formation of the alloy portion comprising the metal and the semiconductor material in a boundary part between the metal layer and the first conductivity-type crystalline semiconductor particles and the formation of the first conductivity-type region having high impurity concentration in an interfacial part between the alloy portion and the first conductivity-type crystalline semiconductor particle, the metal and the semiconductor particles can be securely joined, thereby improving the reliability of the joining condition between the substrate and the crystalline semiconductor particles. It is therefore possible to realize a photoelectric conversion device with high conversion efficiency.

A method of manufacturing a photoelectric conversion device according to this invention comprises the steps of: applying an insulator to a metal substrate or a substrate formed with a metal layer on its surface and depositing numerous first conductivity-type crystalline semiconductor particles thereon; pressing the first conductivity-type crystalline semiconductor particles from above the insulator so as to bring them into contact with the metal layer; heating the substrate and the insulator so as to form an alloy portion comprising the metal and the semiconductor material and a first conductivity-type semiconductor region with high impurity concentration in a boundary part between the substrate and the first conductivity-type crystalline semiconductor particles; and forming a second conductivity-type semiconductor region on the upper portions of the first conductivity-type crystalline semiconductor particles.

According to this method of manufacturing a photoelectric conversion device, an insulator is applied to the substrate on which numerous first conductivity-type crystalline semiconductor particles are deposited. The first conductivity-type crystalline semiconductor particles are pressed from above the insulator so as to be contacted with the metal layer, and then the substrate and the insulator are heated so that an alloy portion comprising the metal and the semiconductor material and a first conductivity-type region having high impurity concentration are formed in a boundary part between the substrate and the first conductivity-type crystalline semiconductor particles, and a second conductivity-type semiconductor region is further formed on the upper portions of the first conductivity-type crystalline semiconductor particles. Accordingly, the metal and the semiconductor material can be securely joined by this method, so that it is possible to obtain a photoelectric conversion device having high conversion efficiency with high reliability in the joining condition between the substrate and the crystalline semiconductor particles.

It is possible for the first conductivity-type and the second conductivity-type to be p type and n type, respectively. The "metal" referred to above may be, for example, aluminum.

Another photoelectric conversion device according to this invention comprises: numerous crystalline semiconductor particles deposited on a substrate serving also as the electrode of one side; an insulator interposed among the crystalline semiconductor particles, and the other electrode formed above the crystalline semiconductor particles, wherein the crystalline semiconductor particle has a central portion being a first conductivity type, and a peripheral portion being a second conductivity type, the second conductivity-type peripheral portion around the junction between the crystalline semiconductor particle and the substrate having been removed by reaction between the insulator and the crystalline semiconductor particle.

This photoelectric conversion device according to the present invention is arranged such that crystalline semiconductor particles, which are previously provided with PN-junctions by having central portions being a first conductivity type and peripheral portions being a second conductivity type, are deposited on a substrate and joined to the substrate by means of alloy portions where both of them are fused, and an insulator made of a glass material is interposed among the crystalline semiconductor particles.

The structure above permits the crystalline semiconductor particles to be manufactured with low grain size accuracy, and ensures separation of the positive electrode from the negative electrode by the insulator. In this structure, it is unnecessary to form a conductive diffusion region that penetrates the PN-junction and is connected to the inner layer, and yet separation of the PN-junctions in the crystalline semiconductor particles can be carried out.

In addition, without need to bore holes in the electrodes, a stable junction can be obtained between the substrate and the crystalline semiconductor particles. The previous formation of the PN-junction allows for eased management of the cleaning process and the production environment for PN-junction formation. In addition, the light incident on the areas where the crystalline semiconductor particles are not present can be utilized.

Accordingly, this invention has enabled manufacture of a low-cost photoelectric conversion device with high conversion efficiency capable of yielding a large manufacturing margin.

Furthermore, owing to the flexibility in shape, the photoelectric conversion device of this invention has little dependence on the light incidence angle.

Structural details of the present invention are hereinafter described referring to the drawings.

BRIEF DESCRIPTION OF THE DRAWINGS

FIG. 9

DETAILED DESCRIPTION OF THE INVENTION

1. First Embodiment

Figure 1:
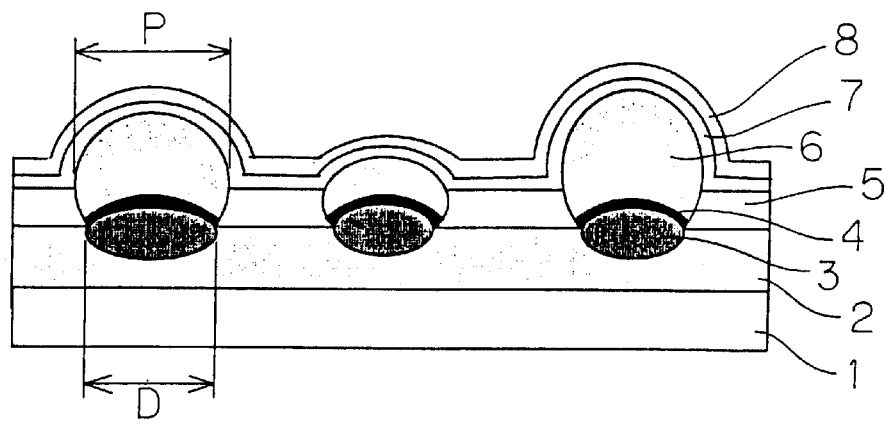
FIG. 1 is a cross sectional view of a first embodiment of the photoelectric conversion device according to the present invention.

FIG. 1 is a cross sectional view of an embodiment of the present invention, wherein the numerals denote parts as follows:

1: substrate, 2: aluminum layer, 3: alloy portion comprising aluminum and semiconductor material, 4: p+ type region, 5: insulator layer, 6: p type crystalline semiconductor particle, 7: n type semiconductor region, 8: protective layer.

The substrate 1 comprises a metal such as aluminum, ceramics, or resin. The substrate may be of any kind as long as it has conductivity in at least its surface part. In the case of using an insulator such as ceramics or resin as the substrate, a conductive layer 2 made of aluminum or the like may be formed on the substrate.

The aluminum layer 2 is not limited to one that comprises only aluminum, but may be other ones that include B, C, N, O, Si, Fe, Mn, Cr or the like added thereto by 30% or so. The aluminum layer 2 may comprise solid-state aluminum or one made by baking aluminum paste. The thickness of the aluminum layer 2 is preferably in the range of 10–300 μm. At thicknesses less than 10 μm, the alloy portion 3 comprising aluminum and semiconductor material and the p+ type region including aluminum are not sufficiently formed, and at thicknesses more than 300 μm, the alloy portion 3 comprising aluminum and semiconductor material is overly formed.

In the boundary parts between the aluminum layer 2 and the p type crystalline semiconductor particles 6, the alloy portions 3 are formed. The alloy portions 3 are formed such that the p type crystalline semiconductor particles 6 are brought into contact with the aluminum layer 2 and pressed so as to deform the aluminum layer 2 to fit to the shapes of the p type crystalline semiconductor particles 6, and then heat is applied. The heating temperature should preferably be in the range of 580–900° C. and the heating time should preferably be 1–20 minutes.

The composition ratio of the semiconductor material to the aluminum in the aluminum-semiconductor material alloy portions 3 should preferably be in the range of 1.5–20%. When the composition ratio of the semiconductor material to the aluminum is below 1.5%, the p+ type regions 4 including the aluminum are not formed sufficiently, thereby deteriorating the conversion efficiency. When the composition ratio of the same is above 20%, the electrical resistance becomes large, which also lowers the conversion efficiency.

In the interfacial parts between the alloy portions 3 and the p type crystalline semiconductor particles on the side of the p+ type crystalline semiconductor particles, the p+ regions 4 including aluminum are formed. The p+ type regions 4 are formed by contacting the aluminum layer 2 with the p type crystalline semiconductor particles 6 and heating them.

The average value of the diameter D (see FIG. 1) of the p+ type regions 4 should preferably be 30–80% of the average value of the diameter P of the p type crystalline semiconductor particles 6. When it is below 30% of the average value of the diameter P, the p+ type regions 4 are not sufficiently formed, which results in a decrease of the conversion efficiency. When it is above 80% of the same, the p+ type regions 4 are excessively formed and directly contact with the n type semiconductor region 7 causing short circuit. Also, in that case, the p type crystalline semiconductor particles 6 are reduced in volume, which lowers the conversion efficiency.

Preferably, the average thickness of the p+ type regions 4 should be 0.3–5 μm. When the average thickness is less than 0.3 μm, it is hard to form an ohmic junction, and recombination of carriers at surface becomes intense. The concentration of the aluminum contained in the p+ type regions 4 is preferably be $1\times10^{18}$ atm/cm$^3$ or more. When the aluminum concentration is below $1\times10^{18}$ atm/cm$^3$, it is hard to form an ohmic junction, as well as recombination of carriers at surface becomes intense.

The insulator 5 is interposed among the p type crystalline semiconductor particles 6 such that the upper portions of the p type crystalline semiconductor particles 6 are exposed. This insulator 5 comprises an insulating material for separating the positive electrode from the negative electrode. The insulating material may be, for example, glass slurry composed of components arbitrarily selected from $SiO_2$, $Al_2O_3$, PbO, $B_2O_3$, ZnO, and the like.

The p type crystalline semiconductor particles 6 comprise Si, Ge, and a small amount of p type impurity such as B, Al, and Ga. The shapes of the semiconductor particles 6 may comprise polygons, curved surfaces or the like. Preferably, they should comprise curved surfaces, especially spherical shapes so that they efficiently push the insulator 5 aside when they are pressed until they come into contact with the aluminum layer 2.

On the upper portions of the p type semiconductor particles 6, a n type semiconductor region 7 is formed. The n type semiconductor region 7 is formed by lamination, for example, by the vapor-phase growth method. When the vapor-phase growth method is used, a vapor-phase phosphorous system compound that is a n type impurity is added in a small amount to a vapor-phase silane compound. The n type semiconductor region 7 may be monocrystal, polycrystalline, microcrystalline or amorphous. The n type semiconductor region 7 may be formed on the upper portions of the p type semiconductor particles 6 by ion implantation or the thermal diffusion method. In such a case, it is possible to cover the entire surface with a transparent conductive film after forming the n type semiconductor region 7.

A protective film 8 may be formed on the n type semiconductor region 7. The protective film 8 should preferably have the characteristics of a transparent dielectric. It is formed by the CVD method, the PVD method or the like, in which, for example, one or a plurality of materials selected from among silicon oxide, cesium oxide, aluminum oxide, silicon nitride, titanium oxide, $SiO_2$—$TiO_2$, tantalum oxide, yttrium oxide are used to form a single layer or a combined layer on the n type crystalline semiconductor layer 7. Being in contact with the surface where light is incident, the protective film 8 needs to have transparency.

Meanwhile, it is also possible to provide a patterned electrode comprising fingers and bus bars at regular intervals on the crystalline semiconductor layer 7 or the protective layer 8 so as to lower the series resistance, thereby improving the conversion efficiency.

In the case of the first embodiment described above, it is possible to reverse the conductivity type of the semiconductors such that the semiconductor particles 6 are the n type, and the semiconductor region 7 is the p type. In addition, instead of aluminum as the metal, a metal including In or Ga may be used as well.

EXAMPLE 1.1

Now, an example of the present invention is described referring to FIG. 1.

First, an aluminum layer 2 was formed on a stainless substrate 1 by rolling a stainless raw material and an aluminum raw material, and joining them together. An insulator layer 5 was then formed on the aluminum layer 2, in which glass paste was used to form the insulator layer 5 to be 200 μm thick. Then, p type silicon particles 6 with an average diameter of 0.5 mm were densely deposited on the insulator layer 5. Pressure was applied to the silicon particles 6 so as to sink them into the insulator layer 5 until they come into contact with the aluminum layer 2. The silicon particles 6 were further pressed so that the aluminum layer 2 was deformed along the shapes of the silicon particles 6. Subsequently, they were heated at 630° C. for 10 minutes so as to form aluminum-silicon alloy layers 3 and p+ type regions 4 including aluminum. The average diameter of the p+ type regions was adjusted by modifying the pressure applied before the heating and the heating time. Then, a n type silicon layer was formed 100 nm thick over the silicon particles 6 and the insulator layer 5, on which a silicon nitride film was formed 300 nm thick as a protective film 8.

A result of evaluation of the conversion efficiency obtained by varying the average diameter of the p+ type regions 4 is shown in Table 1(Samples 1–6).

Figure 2:
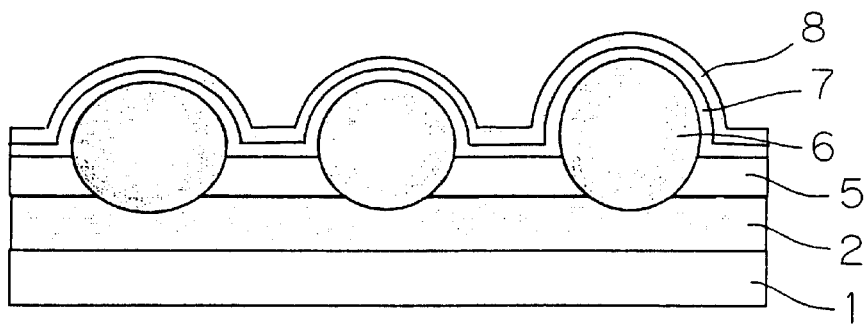
FIG. 2 is a cross sectional view showing a comparative example of a photoelectric conversion device in which p+ type regions are not formed.

FIG. 2 is a cross sectional view of a comparative example (Samples 7–10) in which the p+ type regions 4 were not formed. This comparative example was made by lessening pressure before the heating so as to reduce the area where the silicon particles 6 are in contact with the aluminum layer 2. In Table 1, the sample 7 is a case where the diameter is 0 (no p+-type regions formed).

TABLE 1

| Sample No. | Average diameter of p+ region μm | Ratio to the particle diameter (%) | Conversion efficiency (%) |
|---|---|---|---|
| 1 | 150 | 30 | 8.3 |
| 2 | 200 | 40 | 9.4 |
| 3 | 250 | 50 | 9.7 |
| 4 | 300 | 60 | 10.0 |
| 5 | 350 | 70 | 11.2 |
| 6 | 400 | 80 | 10.5 |
| 7 | 0 | 0 | 1.0 or less |
| 8 | 50 | 10 | 2.4 |
| 9 | 100 | 20 | 4.8 |
| 10 | 450 | 90 | Measurement was impossible |

As is apparent from Table 1, in the case where no p+ type regions were present (Sample 7), the conversion efficiency largely dropped to 0.1% or less. Good conversion efficiencies were obtained when the average diameter of the p+ type regions was 30–80% of that of the silicon particles (Samples 1–6). When the average diameter of the p+ type regions was less than 30% (Samples 8, 9), the conversion efficiency decreased, and when it was over 80% (Sample 10), measurement of conversion efficiency was impossible due to short circuit caused by direct contact between the p+ type regions and the n type silicon layer.

Accordingly, the samples 1–6 correspond to an embodiment of this invention.

EXAMPLE 1.2

A result obtained by varying the average thickness of the p+ type regions is shown in Table 2. The thickness was adjusted by varying heating temperature and heating time.

TABLE 2

| Sample No. | Average thickness of p+ crystalline semiconductor region (μm) | Conversion efficiency (%) |
|---|---|---|
| 11 | 0.3 | 7.6 |
| 12 | 0.5 | 8.8 |
| 13 | 1.0 | 9.5 |
| 14 | 3.0 | 9.7 |
| 15 | 5.0 | 9.7 |
| 16 | 0.1 | 1.2 |
| 17 | 0.2 | 3.3 |
| 18 | 7.0 | Measurement was impossible |

It is understood from Table 2 that good conversion efficiencies were obtained when the average thickness of the p+ type regions was 0.3–5 μm. When the average thickness of the p+ type regions was less than 0.3 μm, the conversion efficiency decreased, and when it was larger than 5 μm, the p+ type regions contacted with the n type crystalline silicon layer causing short circuit, or due to aluminum spike, the aluminum layer contacted with the n type crystalline silicon layer causing short circuit, which made measurement of conversion efficiency impossible.

Accordingly, the samples 11–15 correspond to an embodiment of this invention.

EXAMPLE 1.3

A result obtained by varying the composition ratio of the silicon to the aluminum in the aluminum-silicon alloy layer 3 is shown in Table 3. Adjustment was carried out by modifying the composition of the aluminum layer 2 and heating time.

The 0 silicon composition ratio indicates that no aluminum-silicon alloy layers were formed (Sample 27).

TABLE 3

| Sample No. | Ratio of silicon to aluminum (%) | Conversion efficiency (%) |
|---|---|---|
| 21 | 1.5 | 7.2 |
| 22 | 2.0 | 8.6 |
| 23 | 5.0 | 11.2 |
| 24 | 10.0 | 10.1 |
| 25 | 15.0 | 8.9 |
| 26 | 20.0 | 7.4 |
| 27 | 0.0 | 1.0 or less |
| 28 | 0.5 | 2.4 |
| 29 | 1.0 | 4.6 |
| 30 | 25.0 | 4.0 |

Table 3 indicates that in the case where no aluminum-silicon alloy layers were formed (Sample 27), the conversion efficiency largely dropped to 0.1% or less. Good conversion efficiencies were obtained when the composition ratio of the silicon to the aluminum in the aluminum-silicon alloy layers 3 was 1.5–20% (Samples 21–26). Therefore, the samples 21–26 correspond to an embodiment of this invention.

Second Embodiment

Figure 3:
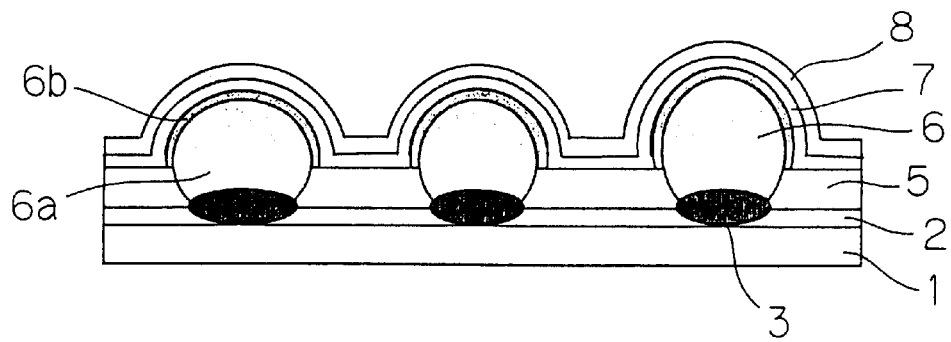
FIG. 3 is a cross sectional view showing a second embodiment of the photoelectric conversion device according to the present invention.
Figure 6:
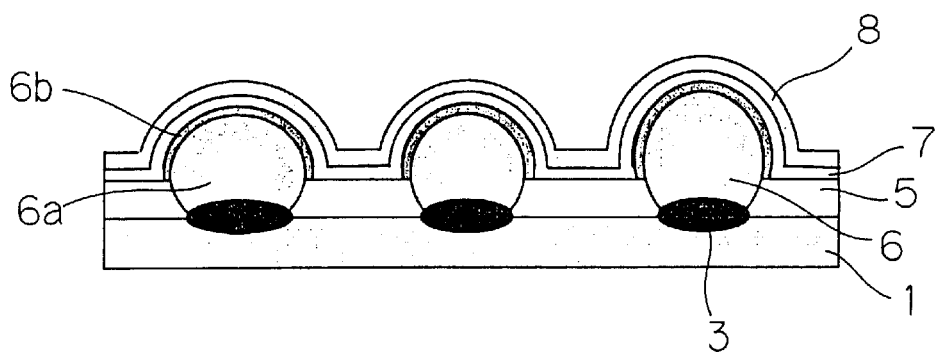
FIG. 6 is a cross sectional view showing the second embodiment of the photoelectric conversion device according to the present invention.

FIGS. 3 and 6 are sectional views showing an embodiment he present invention, where the numeral 1 denotes a substrate, the numeral 6 denotes second conductivity-type crystalline semiconductor particles each of which has a central portion 6a being a first conductivity type and a peripheral portion 6b being a second conductivity type, the numeral 5 denotes an insulator comprising glass material, the numeral 7 denotes a conductive layer, the numeral 8 denotes a protective layer, and the numeral 3 denotes joined portions where the substrate 1 is in contact with the crystalline semiconductor particles 6.

The substrate 1 comprises metal, ceramics or resin. When the substrate is made of an insulator such as ceramics or resin, a conductive layer 2 shown in FIG. 3 needs to be formed. When the material of the substrate 1 is a metal, the substrate 1 may be single layered as shown in FIG. 6, or may be combined with another metal layer.

Each of the crystalline semiconductor particles 6 comprises a central portion 6a comprising Si, Ge, and a small amount of p type impurity such as B, Al, and Ga or n type impurity such as P and As, and a peripheral portion 6b comprising Si, Ge, and a small amount of n type impurity such as P and As, or p type impurity such as B, Al and Ga.

The shapes of the semiconductor particles 6 may comprise polygons, curved surfaces or the like. Preferably, they should comprise curved surfaces, especially spherical shapes so that they efficiently push the insulator 5 aside when they are pressed until they come into contact with the aluminum layer 2.

With the substrate 1 and the crystalline semiconductor particles 6 being in contact with each other, baking is carried out at a temperature over 577° C., which is the eutectic temperature of the substrate material Al and Si, so as to form the joined portions 3. The joined portions 3 are alloy portions where Al, the material of the substrate 1, and the material of the crystalline semiconductor particles 6 in the areas contacting with the substrate 1 melt together. This melting has an effect of destroying the PN-junction of the crystalline semiconductor particles 6 present in the parts contacting with the substrate 1. It is considered that the aluminum, the material of the substrate 1, diffuses and forms a p+ layer in the interfacial part between the first conductivity-type central portion 6a contacting with the alloy portion and the joined portion 3.

The reason for baking over 577° C. is as follows. When forming a conductive diffusion region is simply aimed at, it is achieved by heating at a temperature below 577° C., which is the eutectic temperature of Al and Si. However, in such a case, the connection between the substrate 1 and the crystalline semiconductor particles 6 is so weak that the crystalline semiconductor particles 6 leave the substrate 1, which makes it impossible for the device to maintain the structure as a solar cell.

The particle diameters may be even or uneven. However, uneven particle diameters will be advantageous to make the device less expensive, because an additional process is necessary in order to uniformize the particle diameters. Incidentally, the crystalline semiconductor particles 6 will be brought into sufficient contact with the substrate 1 even when the particle diameters are uneven by using a pressing jig made of a flexible material when pressing the crystalline semiconductor particles 6 from above the insulator layer 5 so as to contact with the substrate 1. Furthermore, since the crystalline semiconductor particles have convex surfaces, dependence on the light incidence angle is small.

Preferably, the particle diameters should be in the range of 10–500 $\mu$m. Particles with diameters less than 10 $\mu$m are not preferable because they cause the insulator layer 5 to adhere to the pressing jig for pressing the particles, thereby contaminating the surfaces of crystalline semiconductor particles 6. Also, using semiconductor particles with diameters exceeding 500 $\mu$m makes no difference in the amount of the semiconductor material to be used from the amount used in conventional flat plate photoelectric conversion devices, which neutralizes the material-saving advantage of using spherical particles.

The insulator 5 comprises an insulating material for separating the positive electrode from the negative electrode. The insulating material may comprise, for example, glass slurry composed of components arbitrarily selected from among $SiO_2$, $B_2O_3$, $Al_2O_3$, CaO, MgO, $P_2O_5$, $Li_2O$, SnO, PbO, ZnO, BaO, $Bi_2O_3$ and the like. The insulator 5 needs to have some degree of hardness or viscosity when placed on the substrate 1 so as to temporarily hold the semiconductor particles 3 pressed thereinto. In addition, it needs to have a characteristic capable of partly covering the semiconductor particles 6 by melting at the temperature of heat applied thereto for creating joined portions 3 between the substrate 1 and the crystalline semiconductor particles 6. Furthermore, at the areas where the insulator 5 is in contact with the crystalline semiconductor particles 6, the surfaces of the insulator 5 and the crystalline semiconductor particles 6 react to each other at the above heating temperature so that the PN-junction parts of the crystalline semiconductor particles 6 are removed, thereby separating the PN-junctions of the crystalline semiconductor particles. This eliminates necessity for separating the PN-junction by another means such as etching.

The conductive layer 7 comprises a second conductivity-type conductive layer comprising Si and/or a transparent conductive layer. When a second conductive-type conductive layer is employed to form the conductive layer 7, it is formed by the vapor growth method, in which, for example, a vapor-phase phosphorous system compound that is a n type impurity or a vapor-phase boron system compound that is a p type impurity is added in a small amount to a vapor-phase silane compound. The film may be crystalline, amorphous, or mixture of crystalline and amorphous. When a transparent conductive layer is employed to form the conductive layer 7, it is formed by a film-forming method such as the sputtering technique or the vapor growth method, or paint-and-baking method, in which one or a plurality of compounds selected from among $SnO_2$, $In_2O_3$, ITO, ZnO, $TiO_2$ and the like are used to form an oxide film. The transparent conductive layer can be expected to have the effect of an antireflection film when the film thickness is selected for such a purpose. Meanwhile, it is necessary for the conductive layer 7 to be transparent so that a part of the incident light passes through the conductive layer 7 at the areas where the crystalline semiconductor particles 6 are not present and reflected by the substrate 1 and directed to the crystalline semiconductor particles 6. This enables the light energy being transmitted in the whole photoelectric conversion device to be efficiently transmitted to the crystalline semiconductor particles 6.

The conductive layer 7 to be formed directly on the surfaces of the crystalline semiconductor particles 6 should preferably be a second conductivity-type conductive layer. The reason for this is as follows:

When the PN-junctions of the crystalline semiconductor particles 6 are removed due to the reaction between the surfaces of the crystalline semiconductor particle 6 and the insulator 5 at the above heating temperature, a few defective portions such as an impurity level are formed in the boundary parts between the insulator 5 and the surfaces of the crystalline semiconductor particles 6. It is considered that when a transparent conductive layer is formed over the crystalline semiconductor particles 6 and the insulator 5, some leakage is generated between the defective portions mentioned above and the transparent conductive layer. On the other hand, forming a second conductivity-type conductive layer 7 on the surfaces of the crystalline semiconductor particles 6 may prevent such leakage from occurring.

The concentration of the microelement in the second conductivity-type conductive layer 7 may be high when considered in view of the conductivity, which is, for example, from $1\times10^{16}$ to $1\times10^{21}$ $atm/cm^3$. Preferably, the conductive layer 7 should be formed along the surfaces of the crystalline semiconductor particles 6 as well as along the convex contours of the crystalline semiconductor particles 6. A wide area will be made available for the PN-junction by forming the conductive layer 7 along the convex contours of the crystalline semiconductor particles 6 so that carriers generated within the crystalline semiconductor particles 6 can be collected efficiently.

It is desirable for the protective film 8 to have the properties of a transparent dielectric. It is formed by the CVD method, the PVD method or the like, in which, for example, one or a plurality of materials selected from among silicon oxide, cesium oxide, aluminum oxide, silicon nitride, titanium oxide, $SiO_2$—$TiO_2$, tantalum oxide, yttrium oxide are used to form a single layer or a combined layer on the conductive layer 7. The protective film 8 needs to be a transparent dielectric because transparency is necessary for a protective film being in contact with the surface where the light is incident. The protective film 8 is also necessary for preventing leakage from occurring between the conductive layer 7 and the outside thereof. Incidentally, optimizing the thickness of the protective film 8 will enable it to function as an antireflection film.

Moreover, it is also possible to provide a patterned electrode comprising fingers and bus bars at regular intervals on the conductive layer 7 or on the protective film 8 so as to lower the series resistance, thereby improving the conversion efficiency.

EXAMPLE 2

Samples were prepared though the following procedure, which is now explained referring to FIG. 4.

Figure 4A:
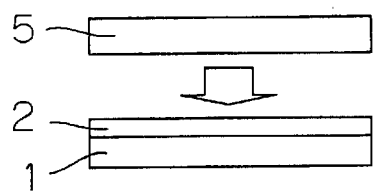
FIGS. 4A–4G illustrate in cross section a manufacturing procedure of the second embodiment of the photoelectric conversion device according to this invention.
Figure 4E:
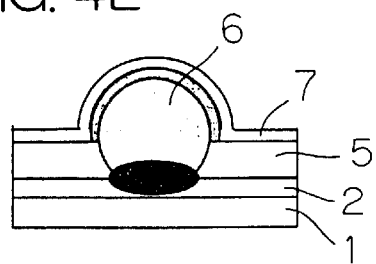
Figure 4B:
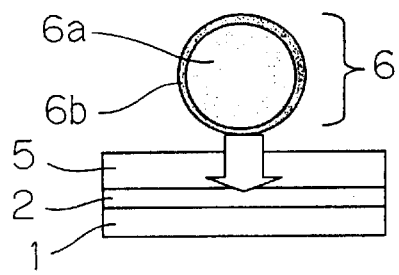

A 50 μm thick aluminum layer 2 was formed on a substrate 1 including iron, on which an insulating layer 5 comprising insulating low-melting-point glass paste was formed 100 μm thick and dried at 80° C. (FIG. 4A). N type silicon particles 6 each of which having a diameter of 250 μm and comprising a p type central portion 6a and a n type peripheral portion 6b were densely deposited on the insulating layer 5 and pressed (FIG. 4B), by which the insulating layer 5 was pushed away and the silicon particles 6 were brought into contact with the aluminum layer 2 simultaneously (FIG. 4C). Then, heating was carried out at a temperature not less than the softening temperature of the insulating glass as well as above the eutectic temperature 577° C. of Al and Si so as to form alloy portions 3 in which Al and Si melt together between the substrate 1 and the silicon particles 6, and to destroy the PN-junction parts between the substrate 1 and the silicon particles 6 (FIG. 4D). Samples having been made in this way is called "sample A".

Sample 41 is a sample made by connecting surfaces of the silicon particles 6 of the sample A to one another by Ag paste.

Sample 42 is a sample made by forming a n type amorphous silicon conductive layer with a thickness of 100 nm on the sample A.

Sample 43 is a sample made by forming a n type crystalline silicon conductive layer with a thickness of 400 nm on the sample A.

Sample 44 is a sample made by forming a n type crystalline-amorphous mixture silicon conductive layer with a thickness of 300 nm on the sample A.

Figure 4F:
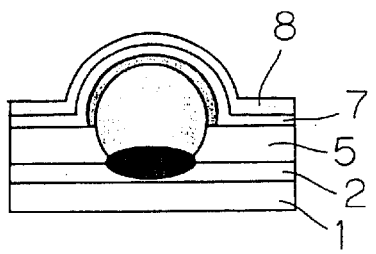
Figure 4C:
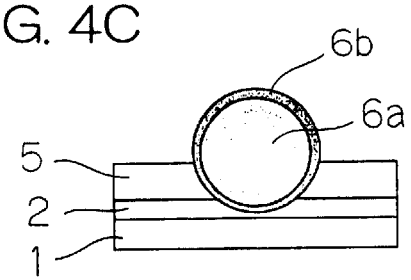

Sample 45 is a sample made by forming a n type crystalline-amorphous mixture silicon conductive layer 7 with a thickness of 200 nm on the sample A (FIG. 4E), and forming a 400 nm thick silicon nitride film as a protective layer 8 on the conductive layer 7 (FIG. 4F).

Sample 46 is a sample made by forming a n type crystalline-amorphous mixture silicon conductive layer with a thickness of 200 nm on the sample A, and forming a 400 nm thick ITO film on the conductive layer as a transparent conductive layer.

Sample 47 is a sample made by forming a n type crystalline-amorphous mixture silicon conductive layer with a thickness of 200 nm on the sample A, and forming a 400 nm thick ZnO film on the conductive layer as a transparent conductive layer.

Sample 48 is a sample made by forming a n type crystalline-amorphous mixture silicon conductive layer with a thickness of 300 nm on the sample A, and forming a 5 nm thick Ti film on the conductive layer as a transparent conductive layer.

Sample 49 is a sample made by forming a n type crystalline-amorphous mixture silicon conductive layer with a thickness of 300 nm on the sample A, and forming a 5 nm thick Au film on the conductive layer as a transparent conductive layer.

Sample 50 is a sample made by forming a n type crystalline-amorphous mixture silicon conductive layer with a thickness of 300 nm on the sample A, and forming a 5 nm thick Pt film on the conductive layer as a transparent conductive layer.

Sample 51 is a sample made by forming a 600 nm thick ITO film as a transparent conductive layer on the sample A.

Sample 52 is a sample made by forming a 5 nm thick Au film as a transparent conductive layer on the sample A.

Sample 53 is a sample made by forming a 400 nm thick ITO film on the sample A as a transparent conductive layer, and forming a 200 nm thick silicon nitride film thereon as a protective layer.

Sample 54 is a sample made by forming a 5 nm thick Au film on the sample A as a transparent conductive layer, and forming a 600 nm thick ITO film thereon as another transparent conductive layer.

Sample 55 is a sample made by forming a n type crystalline-amorphous mixture silicon conductive layer with a thickness of 200 nm on the sample A, and forming a 200 nm thick ITO film thereon as a transparent conductive layer, on which a 200 nm silicon nitride film was formed as a protective layer.

Sample 56 is a sample made by forming a n type crystalline-amorphous mixture silicon conductive layer with a thickness of 200 nm on the sample A, and forming a 5 nm thick Au film thereon as a transparent conductive layer, on which a 400 nm silicon nitride film was formed as a protective layer.

Figure 5:
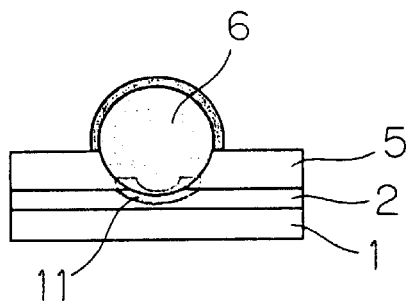
FIG. 5 is a cross sectional view showing a comparative example of a photoelectric conversion device in which the heating temperature is low.

Sample 57 is a sample made in the same way as the sample 41 except that the heating temperature was 567° C., which is under the eutectic temperature 577° C. of Al and Si (FIG. 5).

Figure 7:
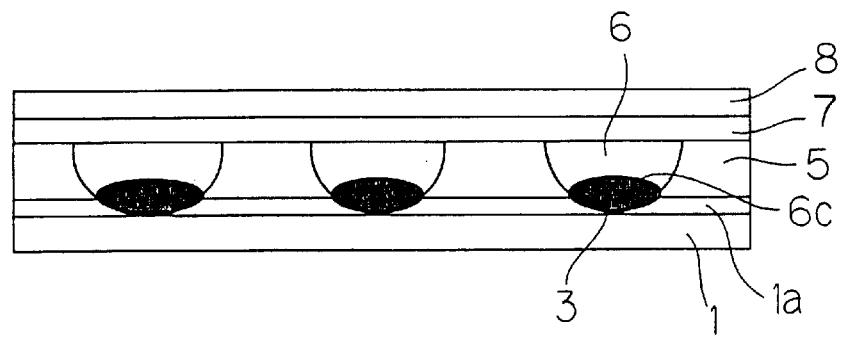
FIG. 7 is a cross sectional view showing a comparative example of a photoelectric conversion device in which the upper portions of silicon particles have been ground.
Figure 8:
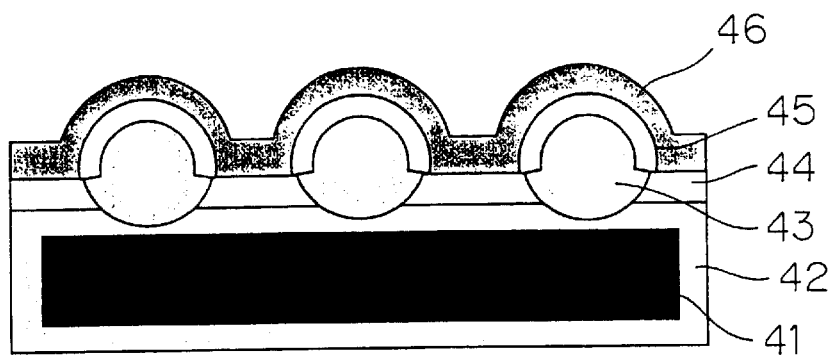
FIG. 8 is a cross sectional view of a conventional photoelectric conversion device.
Figure 9:
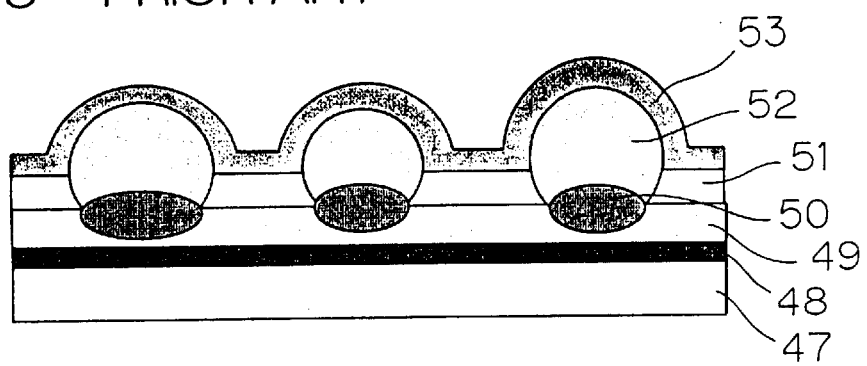
FIG. 9 is a cross sectional view of a conventional photoelectric conversion device.
Figure 10:
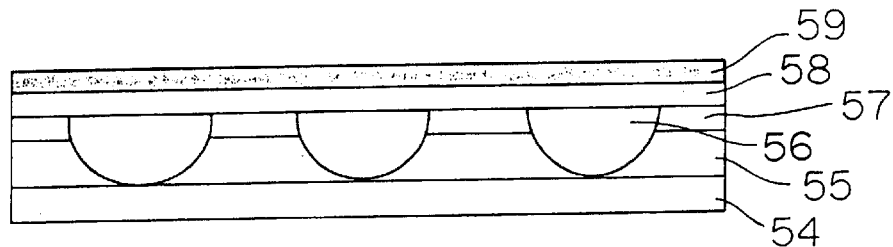
FIG. 10 is a cross sectional view of a conventional photoelectric conversion device.
Figure 11:
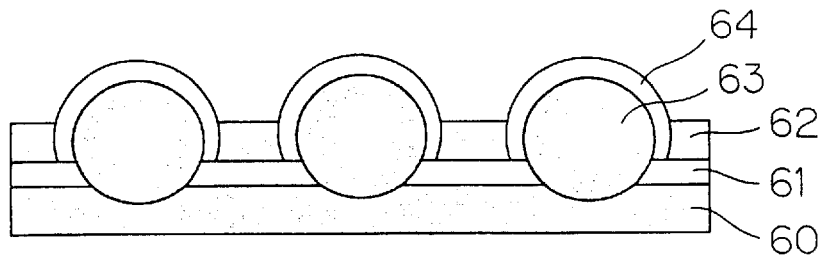
FIG. 11 is a cross sectional view of a conventional photoelectric conversion device.
Figure 12:
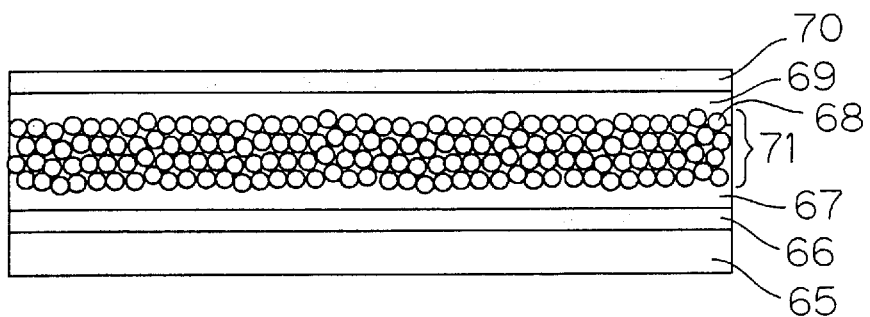
FIG. 12 is a cross sectional view of a conventional photoelectric conversion device.
Figure 13:
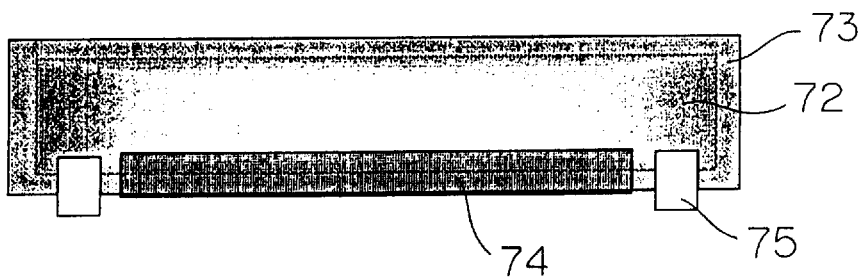
FIG. 13 is a cross sectional view of a conventional photoelectric conversion device.

Sample 58, a cross section of which is shown in FIG. 7, was made in the same way as the sample A except that only p type silicon particles 6 having a diameter of 250 μm were used, in which the silicon particles 6 in the portions protruding from the insulating layer 5 were ground and flattened, and then a n type crystalline-amorphous mixture silicon conductive layer 7 with a thickness of 200 nm was formed on the ground silicon particles 6 and the insulating layer 5 in the same manner as shown in FIG. 4E, and a 400 nm thick silicon nitride film was formed thereon as a protective layer in the same manner as shown in FIG. 4F.

Figure 4G:
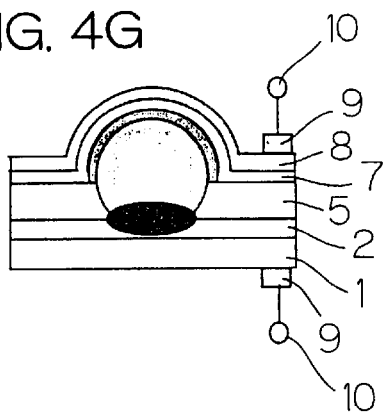
Figure 4D:
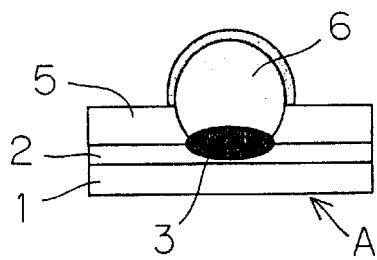

Electrodes 9 were taken from the substrate and the conductive layer in each case of the samples 41–58 (See FIG. 4G).

Five pieces were prepared for each of the samples 41–58, and were irradiated by light incident vertically. The conversion efficiency of each sample was measured, of which result is shown in Table 4. The samples 41–56 correspond to an embodiment of this invention.

TABLE 4

| Sample No. | n type conductive layer | Transparent conductive layer | Protective layer | Conversion efficiency (%) |
|---|---|---|---|---|
| 41 | — | — | — | 7.2 |
| 42 | Amorphous Si | — | — | 9.7 |
| 43 | Crystalline Si | — | — | 9.9 |
| 44 | Amorphous-crystalline mixture Si | — | — | 10.0 |
| 45 | Amorphous-crystalline mixture Si | — | SiN | 10.5 |
| 46 | Amorphous-crystalline mixture Si | ITO | — | 10.4 |
| 47 | Amorphous-crystalline mixture | ZnO | — | 10.4 |
| 48 | Amorphous-crystalline mixture Si | Ti | — | 10.0 |
| 49 | Amorphous-crystalline mixture Si | Pt | — | 10.1 |
| 50 | Amorphous-crystalline mixture Si | Au | — | 10.1 |
| 51 | — | ITO | — | 9.5 |
| 52 | — | Au | — | 9.2 |
| 53 | — | ITO | SiN | 9.4 |
| 54 | — | Au | SiN | 9.5 |
| 55 | Amorphous-crystalline mixture Si | ITO | SiN | 10.3 |
| 56 | Amorphous-crystalline mixture | Au | SiN | 10.4 |
| 57 | — | — | — | 3.3 |
| 58 | Amorphous-crystalline mixture Si | — | SiN | 10.4 |

In the sample 57, separation of the silicon particles 6 from the substrate was so extreme that they left the substrate in two out of the five pieces, and the conversion efficiency was as low as 3.3%.

In the sample 41, no such separation occurred and the conversion efficiency was as high as 7.2%.

The joining condition between the silicon particles 6 and the substrate (aluminum layer 2) was checked on the samples 41 and 57. In the sample 57, because alloy portions were not formed between the silicon particles 6 and the aluminum layer 2 as shown in FIG. 5, more than a half of the silicon particles 6 floated above the aluminum layer 2 and the rest of them were only in contact with the aluminum layer 2. On the other hand, in the sample 41, alloy portions 3 were formed between all the silicon particles 6 and the aluminum layer 2 as shown in FIG. 4D, and the silicon particles 6 and the aluminum layer 2 were joined together through the alloy portions 3. This result indicates that forming alloy portions 3 comprising the silicon particles 6 and the aluminum layer 2 between them for joining them together prevents the silicon particles 6 from leaving the aluminum layer 2 so that the conversion efficiency is improved.

In the samples 42–56 and the sample 58, the problem of the separation of the silicon particles 6 did not arise, and the conversion efficiency was improved in each case by further forming a conductive layer or a conductive layer and a protective layer.

In addition, it has been confirmed in the samples 41–45 that a photoelectric conversion device with good conversion efficiency can be realized even without forming a transparent conductive layer.

Incidentally, the conversion efficiency was improved more in the cases where a n type conductive layer was interposed than in the cases of samples 51–54 in which a transparent conductive layer was directly formed on the sample A. The reason of this is considered that when a part of the PN-junction of the silicon particles was removed by the insulating layer, some extent of an impurity level or the like was formed between the insulating layer and the surfaces of silicon particles, and leakage occurred due to contact between the part having such an impurity level and the transparent conductive layer. Forming a n type conductive layer on the surfaces of the silicon particles seemed to have suppressed occurrence of such leakage.

Finally, as for the sample 58, in which the silicon particles in the portions protruding from the insulating layer were ground and flattened, the conversion efficiency was around the same level as that of the sample 45 when the light was incident vertically on it. A result obtained when the samples 45 and 58 were measured again after being irradiated by light incident at 45° is shown in Table 5.

TABLE 5

| Sample No. | n type conductive layer | Transparent conductive layer | Protective layer | Conversion efficiency (%) |
|---|---|---|---|---|
| 45 | Amorphous-crystalline mixture Si | — | SiN | 9.7 |
| 58 | Amorphous-crystalline mixture Si | — | SiN | 5.9 |

Having the flattened surface, the sample 58 was heavily dependant on the light incidence angle, which resulted in the largely decreased conversion efficiency when the light was incident at 45°. On the other hand, the sample 45 having the curved surface had little dependence on the light incidence angle, so that the decrease in the conversion efficiency was small. The sample 45 was thus proven to be excellent.

Meanwhile, an aluminum substrate with its rear surface being oxidized as shown in FIG. 6, a substrate comprising a Cu plate formed with a 50 μm thick aluminum layer thereon, and a substrate comprising an alumina substrate formed with a 50 μm thick aluminum layer thereon were also used as the substrate 1, and in each of these cases, a result similar to this example was obtained.

What is claimed is:

1. A photoelectric conversion device comprising:

a metal substrate or a substrate formed with a metal layer on its surface;

numerous first conductivity-type crystalline semiconductor particles deposited on the substrate;

an insulator interposed among the numerous first conductivity-type crystalline semiconductor particles;

and a second conductivity-type semiconductor region formed on the upper portions of the first conductivity-type crystalline semiconductor particles, wherein a boundary part between the metal layer and the first conductivity-type crystalline semiconductor particles comprises individual alloy portions comprising the metal and the material of the semiconductor particles, and a first conductivity-type region with high impurity concentration is formed in an interfacial part between the alloy portion and the first conductivity-type crystalline semiconductor particle on the side of the first conductivity-type crystalline semiconductor particle.

2. The photoelectric conversion device according to claim 1, wherein the first conductivity-type region with high impurity concentration has an average diameter in the range of 30–80% of the average particle diameter of the first conductivity-type crystalline semiconductor particles.

3. The photoelectric conversion device according to claim 1, wherein the first conductivity-type region with high impurity concentration has an average thickness of from 0.3 to 5 μm.

4. The photoelectric conversion device according to claim 1, wherein the average composition ratio of the semiconductor material to the metal in the alloy portion comprising the metal and the semiconductor material is from 1.5 to 20%.

5. The photoelectric conversion device according to claim 1, wherein the first conductivity-type is p type, and the second conductivity-type is n type.

6. The photoelectric conversion device according to claim 1, wherein the metal is aluminum.

7. A photoelectric conversion device comprising:

numerous crystalline semiconductor particles deposited on a substrate serving also as the electrode of one side;

an insulator interposed among the crystalline semiconductor particles;

and the other electrode formed above the crystalline semiconductor particles, wherein the crystalline semiconductor particles having control portions of a first conductivity type and peripheral portions of a second conductivity type, wherein the substrate and each of the crystalline semiconductor particles are joined together by an alloy portion formed by melting together the substrate and that crystalline semiconductor particle.

8. The photoelectric conversion device according to claim 7, wherein the average particle diameter of the crystalline semiconductor particles is from 10 to 500 μm.

9. The photoelectric conversion device according to claim 7, wherein the first conductivity-type is p type, and the second conductivity-type is n type.

10. The photoelectric conversion device according to claim 7, wherein a transparent conductive layer is formed over the crystalline semiconductor particles and the insulator.

11. The photoelectric conversion device according to claim 10, wherein a protective layer is formed on the transparent conductive layer.

12. The photoelectric conversion device according to claim 10, wherein parts where the crystalline semiconductor particles are in contact with the transparent conductive layer comprises a convex surface configuration.

13. The photoelectric conversion device according to claim 12, wherein a protective layer is formed on the transparent conductive layer.

14. A photoelectric conversion device comprising:

numerous crystalline semiconductor particles deposited on a substrate serving also as the electrode of one side;

an insulator interposed among the crystalline semiconductor particles;

and the other electrode formed above the crystalline semiconductor particles, wherein the crystalline semiconductor particles have central portions of a first conductivity type and peripheral portions of a second conductivity type, and wherein a second conductivity-type conductive layer comprising Si is formed over the crystalline semiconductor particles and the insulator.

15. The photoelectric conversion device according to claim 14, wherein a protective layer is formed on the second conductivity-type conductive layer.

16. The photoelectric conversion device according to claim 14, wherein parts where the crystalline semiconductor particles are in contact with the second conductivity-type conductive layer comprises a convex surface configuration.

17. The photoelectric conversion device according to claim 16, wherein a protective layer is formed on the second conductivity-type conductive layer.

18. A photoelectric conversion device comprising:

numerous crystalline semiconductor particles deposited on a substrate serving also as the electrode of one side;

an insulator interposed among the crystalline semiconductor particles;

and the other electrode formed above the crystalline semiconductor particles, wherein the crystalline semiconductor particles have central portions of a first conductivity type and peripheral portions of a second conductivity type, and wherein a second conductivity-type conductive layer comprising Si and a transparent conductive layer are formed over the crystalline semiconductor particles and the insulator.

19. The photoelectric conversion device according to claim 18, wherein a protective layer is formed on the transparent conductive layer.

20. The photoelectric conversion device according to claim 18, wherein parts where the crystalline semiconductor particles are in contact with the second conductivity-type conductive layer comprises a convex surface configuration.

* * * * *